United States Patent
Yano (10) Patent No.: US 6,323,687 B1
(45) Date of Patent: Nov. 27, 2001

(54) OUTPUT DRIVERS FOR INTEGRATED-CIRCUIT CHIPS WITH VCCQ SUPPLY COMPENSATION

(75) Inventor: Masaru Yano, Sunnyvale, CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/706,151

(22) Filed: Nov. 3, 2000

(51) Int. Cl.[7] .............................................. H03K 19/0175
(52) U.S. Cl. .................................. 326/83; 326/80; 326/27
(58) Field of Search ................................. 326/80, 81, 82, 326/83, 86, 87, 26–28, 31

(56) References Cited

U.S. PATENT DOCUMENTS

| | | | |
|---|---|---|---|
| 4,553,200 | 11/1985 | Sibley | 714/34 |
| 4,975,598 | 12/1990 | Borkar | 326/32 |
| 5,161,120 | 11/1992 | Kajimoto et al. | 365/189.05 |
| 5,254,883 | * 10/1993 | Horowitz et al. | 326/87 |
| 5,274,284 | 12/1993 | Krenik et al. | 326/62 |
| 5,285,116 | 2/1994 | Thaik | 326/21 |
| 5,608,687 | 3/1997 | Komarek et al. | 365/233.5 |
| 5,621,335 | 4/1997 | Andresen | 326/30 |
| 5,696,464 | 12/1997 | Bartlett | 327/538 |
| 5,701,090 | 12/1997 | Hidaka et al. | 326/32 |
| 5,729,154 | 3/1998 | Taguchi et al. | 326/30 |
| 5,903,500 | 5/1999 | Tsang et al. | 365/189.05 |
| 5,933,026 | 8/1999 | Larsen et al. | 326/81 |
| 5,955,904 | 9/1999 | Kawasaki | 327/156 |
| 6,018,252 | 1/2000 | Imaizumi | 326/81 |
| 6,047,346 | 4/2000 | Lau et al. | 710/126 |
| 6,094,069 | * 7/2000 | Magane et al. | 326/83 |
| 6,177,809 | * 1/2001 | Tonti et al. | 326/83 |

* cited by examiner

*Primary Examiner*—Michael Tokar
*Assistant Examiner*—Don Phu Le
(74) *Attorney, Agent, or Firm*—Coudert Brothers (57) ABSTRACT

Disclosed are output drivers for integrated circuit chips which receive a second supply voltage VCCQ for driving signals off the chips. The output drivers according to the present invention can accept a wide range of voltage values for the second supply voltage VCCQ, and control their rise and fall slew times so that there is only a small variation in the slew times over a wide range of VCCQ values. The charging and discharging of the driver's pull-up and pull-down transistors is varied as a function of the second supply voltage VCCQ. In one set of embodiments, constructive discharge current branches and charging current branches are selectively activated depending upon the value of VCCQ. In other embodiments, counteracting discharge current branches and charging current branches are selectively activated depending upon the value of VCCQ. Drivers according to the present invention enable integrated circuits to be used with a wide variation of second supply voltages VCCQ while maintaining consistent slew times and low noise levels.

24 Claims, 3 Drawing Sheets

OUTPUT DRIVERS FOR INTEGRATED-CIRCUIT CHIPS WITH VCCQ SUPPLY COMPENSATION

FIELD OF THE INVENTION

The present invention relates to output drivers for integrated circuit chips, and more particularly to reducing the variation in the slew time of the output buffer.

BACKGROUND OF THE INVENTION

Many integrated circuit chips, particularly memory chips, are being manufactured with two power supply voltages: the standard VCC voltage for powering the core electronics of the chip, and a second voltage VCCQ for powering the output drivers (also called output buffers) of the chip. The output drivers convey the chip's output signals to other chips of the digital system in which the chip is placed, and draw a large amount of current and power to do so. The switching of the output drivers can generate relatively large current and voltage spikes on the power supply and return lines. For this reason, output drivers are typically designed to have controlled rise and fall slew times so that they do not switch logic states too quickly. Because the magnitudes of the current and voltage spikes are proportional to the slew times, controlling the slew times will control the magnitudes of the spikes.

Using a separate supply voltage VCCQ for the output drivers has at least two advantages. First it enables one to use different external bypass capacitors for the two supplies VCC and VCCQ, which helps to isolate the current and voltage spikes from the core of the integrated circuit. Second, it enables one to adjust the output voltage levels of the chip to match those of the digital system without the use of special interface circuitry. As in known in the art, the electronics industry is using a wide variety of supply voltages for digital circuits, ranging from 1.5 V to 5 V, with 2.5V and 3.3 V being popular choices. Memory devices are used in a wide variety of applications, which are powered by a wide range of voltages. Often it is found that the speed performance of a memory device works well at a particular voltage, which may or may not be the same as the voltage used by the rest of the digital system. The second VCCQ supply enables the circuit designer to provide the core of the memory device with the voltage that optimizes its performance through the VCC pin, and to provide the output drivers with the voltage that interfaces with the rest of the digital system through the VCCQ pin.

However, part of the overall speed performance of a memory device (or other digital circuit chip) is dependent upon both the speed performance of the chip's core circuits and the rising and falling slew times of the output drivers. In current chip designs, these slew times are highly dependent upon the value of the VCCQ voltage. And thus, a circuit designer is constrained to a limited range of VCCQ if he wants to achieve optimal speed performance from the chip.

SUMMARY OF THE INVENTION

The present invention recognizes that the rise and fall times at the output node of an output driver can also be made to depend upon the rate at which the gate of driver's pull-down transistor is discharged (for rising transitions at the output node), and upon the rate at which the gate of driver's pull-up transistor is charged (for falling transitions at the output node). The present invention further recognizes that the charging and discharging of the gates of pull-up and pull-down can be controlled to compensate for the variation in slew times due to variations in VCCQ and to thereby reduce this variation caused by different values of VCCQ.

Broadly stated, the present invention encompasses an output buffer for a digital integrated circuit chip, the chip having a core which is powered by a first supply voltage VCC which is received at a first supply voltage port. Broadly stated, an output buffer according to the present invention comprises a second supply voltage port for receiving a second supply voltage VCCQ, a power return line port, an output port for providing a voltage output, and an input port for receiving an input data value representative of the voltage value to be provided at said output. The input data value has a first state when a logic-low voltage is to be generated at the output and a second state when a logic-high voltage is to be generated at the output. The output buffer further comprises a pull-up transistor having a gate electrode, a source electrode, and a drain electrode, one of the source and drain electrodes being coupled to the second voltage supply port and the other of said source and drain electrodes being coupled to the output, and a pull-down transistor having a gate electrode, a source electrode, and a drain electrode, one of the source and drain electrodes being coupled to the return line port and the other of said source and drain electrodes being coupled to the output. The output buffer further comprises one or both of a first logic control circuit and a second logic control circuit, and comprises both in preferred embodiments.

The first logic control circuit is responsive to the input data value and the value of second supply voltage VCCQ, and discharges the gate of the pull-up transistor when the input data value is in its second state. The first logic control circuit discharges the gate of the pull-up transistor at a rate which varies with the value of the second supply voltage. The second logic control circuit is responsive to the input data value and the value of second supply voltage VCCQ, and charges the gate of the pull-down transistor when the input data value is in its second state. The second logic control circuit discharges the gate of the pull-down transistor at a rate which varies with the value of the second supply voltage.

According, it is an object of the present inventions to control the slew times of an output driver predictable amounts over a wide variation in VCCQ.

It is another object of the present inventions to provide output drivers which can be used in a wide variety of circuit applications while maintaining a low noise characteristic of the power supply and return lines, and maintaining low cross-talk on adjacent electrical lines.

These and other objects of the present invention will become apparent to those skilled in the art from the following detailed description of the invention, the accompanying drawings, and the appended claims.

DETAILED DESCRIPTION OF THE INVENTION

Figures 1, 2, 4:
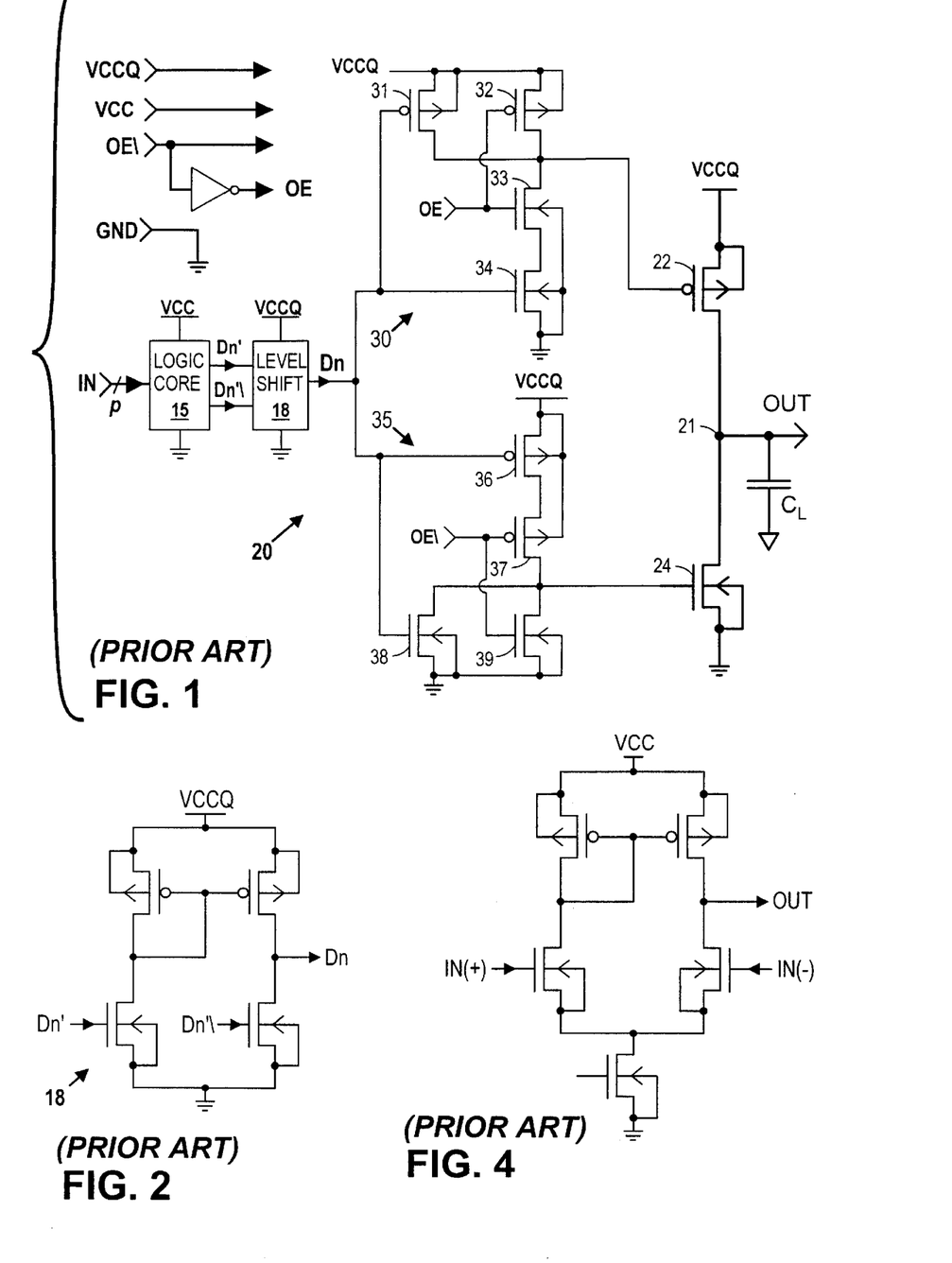
FIG. 1 is a schematic circuit diagram of an output driver according to the prior art.
FIG. 2 is a schematic circuit diagram of an exemplary voltage-level shifter according to the prior art.
FIG. 4 is a schematic circuit diagram of an exemplary comparator according to the prior art.

FIG. 1 shows a typical schematic circuit diagram of a digital chip 10 having a logic core 15 and an output driver 20. The chip receives a first power supply voltage VCC for powering logic core 15, a second power supply VCCQ for powering output buffer 20, an output enable signal OE\ for enabling the output of driver 20 to be in an active (low-impedance) state, a ground supply GND, and a set IN of p inputs to the logic core 15 of chip 10. According to a well-established convention, the symbol "\" is used in the present specification and drawings to indicate the complement version of an electrical signal. The chip typically has a plurality of n outputs, each requiring an output driver. Driver 20 is shown for the n-th output of the chip, which is driven by the n-th internal output Dn' of core 15. Logic core 15 may have any desired function, such as memory, instruction processing, control, application specific, etc. Before output Dn' is provided to output driver 20, it is sent through a level shifter 18, which translates the logic high values of Dn', which are at VCC, to the level of VCCQ. The translated signal is indicated as Dn in the figures. There are many well-known implementations for level shifter 18 which may be used. FIG. 2 shows one example where a current mirror responsive to signal Dn' has been used to provide a pull-up current from supply VCCQ. (The complement signal Dn\ may be generated by exchanging the inputs Dn' and Dn'\ in the circuit).

Referring back to FIG. 1, output driver 20 comprises an output node 21 for providing the driver's output, a pull-up transistor 22 having its conduction terminals (drain and source) coupled between output node 21 and second power supply VCCQ, and a pull-down transistor 24 having its conduction terminals (drain and source) coupled between output node 21 and the ground return line (GND). Pull-up transistor 22 generates rising transitions (low-to-high) at output node 21, and preferably comprises a PMOS transistor. Pull-down transistor 24 generates falling transitions (high-to-low) at output node 21, and preferably comprises an NMOS transistor.

Output driver 20 further comprises a NAND gate 30, which receives the Dn and OE signals as inputs, and which provides its output to the modulation terminal (e.g., gate) of pull-up transistor 22. NAND gate 30 comprises two PMOS transistor 31 and 32, and two NMOS transistors 33 and 34 configured in the well-known CMOS NAND-gate structure. In a similar manner, output driver 20 further comprises a NOR gate 35, which receives the Dn and OE\ signals as inputs, and which provides its output to the modulation terminal (e.g., gate) of pull-down transistor 24. NOR gate 35 comprises two PMOS transistor 36 and 37, and two NMOS transistors 38 and 39 configured in the well-known CMOS NOR-gate structure. Both of gates 30 and 35 are powered by the second supply voltage VCCQ.

Pull-up transistor 22 and pull-down transistor 24 are to be placed in non-conducting states when the output-enable signal OE\ is in its logic-high state, and one of the two transistors 22 and 24 is to be placed in a conducting state (thereby giving the output of driver 20 a low impedance state) when the output-enable signal OE\ is in a logic-low state. When the output-enable signal OE\ is in its logic-high state, PMOS transistor 37 of NOR gate 35 is in a non-conducting state while NMOS transistor 39 is in a conducting state. As a result, supply potential VCCQ is blocked from the gate of NMOS pull-up transistor 24, while ground potential is coupled to the gate of transistor 24, which places transistor 24 in a non-conducting state. This occurs regards of the logic state of the second input signal Dn. In NAND gate 30, the complement output-enable signal OE has the opposite logic state as signal OE\, and has a logic-low value when OE\ is in its logic-high state. Under this condition, NMOS transistor 33 is in a non-conducting state which PMOS transistor 32 is in a conducting state. As a result, ground potential is blocked from the gate of PMOS pull-up transistor 22 while supply potential VCCQ is coupled to the gate of transistor 22, which places transistor 22 in a non-conducting state. This occurs regards of the logic state of the input signal Dn.

When output enable signal OE\ is in its logic-low state, the conduction states of pull-up transistor 22 and pull-down transistor 24 are set by the logic state of the second input signal Dn from core 15. In NOR gate 35, PMOS transistor 37 is in a conducting state and NMOS transistor 37 is in a non-conducting state when OE\ is in a logic-low state. The output state of NOR gate is determined by signal Dn. When signal Dn is in a logic-low state, PMOS transistor 36 is in a conducting state and NMOS transistor 38 is in a non-conducting state. As a result, supply voltage VCCQ is coupled through PMOS transistors 36 and 37 to the gate of NMOS pull-down transistor 24, causing pull-down transistor 24 to be in a conducting state. This in turn brings the voltage of output node 21 to a logic-low level (ground potential), and thus the logic state of output node 21 follows that of data signal Dn from core 15. When signal Dn is in a logic-high state (and with signal OE\ in a logic-low state), NMOS transistor 38 is in a conducting state while PMOS transistor is in a non-conducting state. NMOS transistor 38 thereby coupled ground potential to the gate of NMOS pull-down transistor 24, causing it to enter a non-conducting state. The voltage of output node 21 will be set in a logic high-state by NAND gate 30, as described immediately below.

Turning now to NAND gate 30, when output-enable signal OE\ is in its logic-low state, the complement signal OE to NAND gate 30 is in a logic-high state. As a result, PMOS transistor 32 is in a non-conducting state, and NMOS transistor 33 is in a conducting state. When signal Dn is in a logic-high state, PMOS transistor 31 is in a non-conducting state and NMOS transistor 34 is in a conducting state. Under these values of Dn and OE, both of NMOS transistors 33 and 34 are in conducting states, and couple ground potential to the gate of pull-up transistor 22. This results in PMOS pull-up transistor 22 being placed in a conducting state, leading to a logic high-state at output node 21. As previously described, pull-down transistor 24 is in a non-conducting state under these values of Dn and OE, and thus it allows pull-up transistor to set the logic state of node 21. When signal Dn is in a logic low state (while OE is still in a logic high state), PMOS transistor 31 is in a conducting state and NMOS transistor 34 is in a non-conducting state. PMOS transistor 31 thereby couples supply voltage VCCQ to PMOS pull-up transistor 22 while NMOS transistor 34 blocks the application of ground potential. This results in pull-up transistor 24 being placed in a non-conducting state, and enables NOR gate 35 to placed pull-down transistor 24 in a conducting state, as described above.

In the above manner, NAND gate 30 and NOR gate 35 control the voltages to drive transistor 22 and 24 such that:

both drive transistors are in non-conducting states whenever output enable signal OE\ is in a logic high state, which produces a high-impedance state at output node 21;

pull-up transistor 22 is in a conducting state and pull-down transistor 24 is in a non-conducting state when the output signal OE\ is in a logic low state and the data signal Dn is in a logic-high state; and pull-down transistor 24 is in a conducting state and pull-up transistor 22 is in a non-conducting state when the output signal OE\ is in a logic-low state and the data signal Dn is in a logic-low state.

The latter two conditions cause output node 21 to follow the value of data signal Dn, with node 21 in a low impedance state because one of the drive transistors is conduction.

The rise and fall slew times at node 21 of driver 20 depend upon the load capacitance $C_L$ and the value of the supply voltage VCCQ. The load capacitance $C_L$ represents the amount of charge that has to be either charged by the drain current of pull-up transistor 22 or discharged by the drain current of pull-down transistor 24. As an approximate analysis, the slew time $S_T$ for a rising or falling transition is approximately equal to:

$$S_T = C_L \cdot VCCQ / I_{MAX},$$

where $I_{MAX}$ is the maximum charging current of transistor 22 or discharging current of transistor 24, as the case may be. The above equation is derived from the well-known capacitor current equation $I_C = C \cdot dV/dt$. The maximum charging and discharging currents of transistors 22 and 24 are set by the maximum gate-to-source voltages of the transistors, which in turn are proportional to VCCQ. In general, the maximum charging and discharging currents are proportional to a fractional power n of VCCQ:

$$I_{MAX} \cdot (VCCQ)^n,$$

where n has a value between 1 and 2, depending upon the transistor's gate length. By substituting this equation into the previous equation, we find that the slew time is inversely related to the (n−1) factional power of VCCQ:

$$S_T \cdot 1/(VCCQ)^{n-1}.$$

Thus, the slew time $S_T$ decreases as the value of VCCQ rises.

The present invention is directed to minimizing this variation in slew time. The present invention recognizes that the rise and fall times at node 21 can also be made to depend upon the rate at which the gate of pull-down transistor 22 is discharged (for rising transitions at node 21), and upon the rate at which the gate of pull-up transistor 24 is charged (for falling transitions at node 21). The present invention further recognizes that the charging and discharging of the gates of drive transistors 22 and 24 can be controlled to compensate for the variation in $S_T$ due to VCCQ and to thereby reduce this variation caused by different values of VCCQ. Controlling the slew times to predictable amounts over a wide variation in VCCQ reduces the noise generated on the power supply and return lines, and the cross-talk to nearby electrical lines.

THE PRESENT INVENTION

Figure 3:
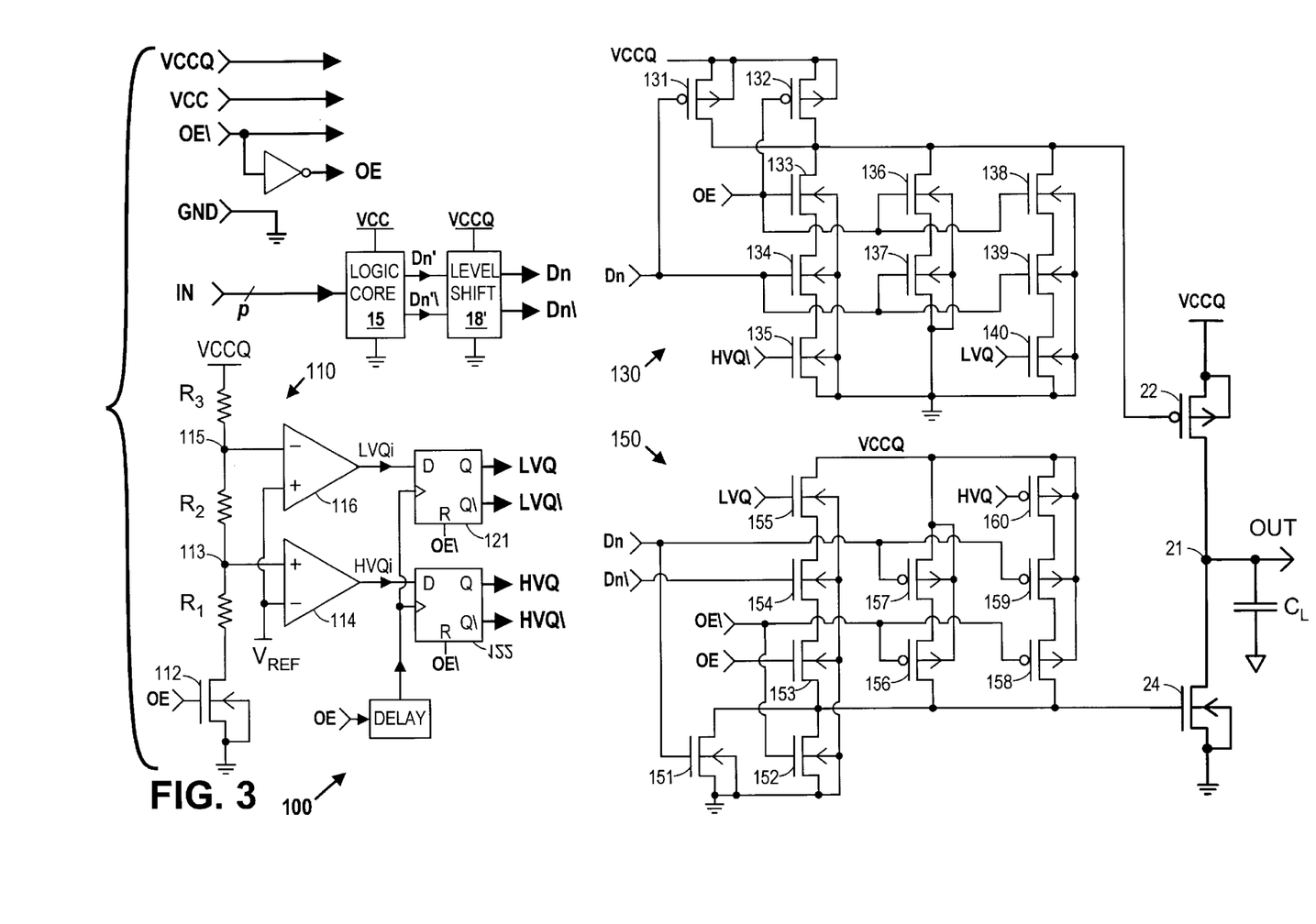
FIG. 3 is a schematic circuit diagram of a first exemplary output driver according to the present invention.

The present invention provides simple circuitry which can control the slew rates of drive transistors 22 and 24 over a wide range of values in voltage VCCQ. FIG. 3 shows a schematic circuit diagram of an exemplary output driver 100 according to the present invention that is suitable for use with a chip logic core 15. As in the case of chip 10 in FIG. 1, the following signals are received: the first power supply voltage VCC for powering logic core 15, the second power supply VCCQ for powering output driver 100, the output enable signal OE\ for enabling the output of driver 100 to be in an active (low-impedance) state, the ground supply GND, and the set IN of p inputs to the logic core 15. Driver 100 is shown for the n-th output of the chip, which is driven by the n-th internal output Dn' of core 15 through a level shifter 18'. As before, logic core 15 may have any desired function, such as memory, instruction processing, control, application specific, etc. Level shifter 18' generates both output Dn and its complement Dn\, and may comprise two of the circuits shown in FIG. 2, one for generating Dn and the other for generating Dn\.

Output driver 100 comprises output node 21, pull-up transistor 22, and pull-down transistor 24 coupled to one another and to the VCCQ and ground supplies as previously described. These components have the same purpose as previously described. Output driver 100 further comprises a voltage detector 10 which detects the value of VCCQ, a first logic control circuit 130 for controlling the charging and discharging of the gate of pull-up transistor 24 in response to signals OE\ and Dn and the detected level of VCCQ, and a second logic control circuit 150 for controlling the charging and discharging of the gate of pull-down transistor 22 in response to signals OE\ and Dn and the detected level of VCCQ. As described in greater detail below, the magnitude of discharging and charging currents provided to drive transistors 22 and 24 respectively is decreased as VCCQ increases in order to minimize the dependency of the slew times on VCCQ.

Voltage Detector 110

Voltage detector 110 monitors the value of second supply voltage VCCQ, and generates two voltage-level signals in response to the monitoring:

LVQi, which has a logic high value when voltage VCCQ is below a first threshold TH1, and a logic low value at other times; and HVQi, which has a logic high value when voltage VCCQ is above a second threshold TH2, and a logic low value at other times.

The second threshold TH2 is preferably greater than the first threshold TH1. The thresholds TH1 and TH2 define a sub-range of voltages for VCCQ that lies between the lowest expected value of VCCQ and the highest expected value for VCCQ. A logic-high value for LVQi means that voltage VCCQ is below this sub-range of voltages, and a logic-high value for HVQi means that voltage VCCQ is above this sub-range. In typical embodiments, the sub-range lies in the middle of the full range of expected values for VCCQ.

The signals HVQi and LVQi are generated by two comparators 114 and 116, and a series connection of three resistors $R_1$–$R_3$, the latter of which are fed by supply voltage VCCQ at one end of the series and selectively coupled to ground through an NMOS transistor 112 at the other end of the series. The complementary output-enable signal OE activates the resistor stack when the OE\ signal set in its logic-low state (which is done to provide an output logic value at output node 21). A node 115 is located at the connection of resistors $R_2$ and $R_3$. A first scaled version of VCCQ is generated at the node and has a value of VCCQ·$(R_1+R_2)/(R_1+R_2+R_3)$. In a similar manner, a node 113 is located at the connection of resistors $R_1$ and $R_2$, and a second scaled version of VCCQ is generated at the node. The second scaled version has the value of VCCQ·$(R_1)/(R_1+R_2+R_3)$. Each of the scaled versions is compared to a reference voltage $V_{REF}$, which has a stable value in the range between zero volts and the lowest expected value for VCCQ. The first scaled version at node 115 being greater in value and magnitude than the second scaled version at node 113. Reference voltage $V_{REF}$ is coupled to the inverting input of comparator 114, and to the non-inverting input of comparator 116. Each comparator outputs a logic-high value when the voltage at its non-inverting input is greater than the voltage at its inverting input, and a logic-low value when the voltage at its non-inverting input is less than the voltage at the inverting input.

Comparator 116 generates a logic-high value for signal LVQi when the first scaled version of VCCQ (at node 113) is less than $V_{REF}$, and a logic-low level for LVQi when the first scaled version is greater than $V_{REF}$:

$$\text{LVQi} = 1 \text{ when } \text{VCCQ} \cdot (R_1 + R_2)/(R_1 + R_2 + R_3) < V_{REF},$$
$$\text{LVQi} = 0 \text{ when } \text{VCCQ} \cdot (R_1 + R_2)/(R_1 + R_2 + R_3) > V_{REF}.$$

The value of the first threshold TH1 can be derived from the above equations as: $\text{TH1}=V_{REF}\cdot(R_1+R_2+R_3)/(R_1+R_2)$. In a similar manner, comparator 114 generates a logic-high value for signal HVQi when the second scaled version of VCCQ exceeds $V_{REF}$, and a logic-low level for VCCQ when the second scaled version is less than $V_{REF}$:

$$\text{HVQi} = 1 \text{ when } \text{VCCQ} \cdot (R_1/(R_1 + R_2 + R_3) > V_{REF},$$
$$\text{HVQi} = 0 \text{ when } \text{VCCQ} \cdot (R_1/(R_1 + R_2 + R_3) < V_{REF}.$$

The value of the second threshold TH2 can be derived from the above equations as: $\text{TH2}=V_{REF}\cdot(R_1+R_2+R_3)/R_1$.

In preferred embodiments of the present invention, the values of LVQi and HVQi are latched into respective D-type flip-flips 121 and 122 a short time duration after the resistor stack is energized by select transistor 112. This operation generates stable versions LVQ and HVQ of the signals LVQi and HVQi, respectively, as well as the complement signals LVQ\ and HVQ\. A delayed version of the complement output-enable signal OE is generated by a delay block 124 and provided to the clock terminals of flip-flops 121 and 122. The output-enable signal OE\ is coupled to the reset terminals of the flip-flops to clear them after the chip has successfully provided its output at output node 21. Since that the switching of the drive transistors 22 and 24 can cause local variations in the voltages of VCCQ and ground, the latching of signals LVQi and HVQi by flip-flops 121 and 122 ensures that these values do not change state during the switching of drive transistors 22 and 24. The values of LVQ, LVQ\, HVQ, and HVQ\ for values of VCCQ relative to TH1 and TH2 are provided by Table I.

TABLE I

| VCCQ | LVQ | LVQ\ | HVQ | HVQ\ |
|---|---|---|---|---|
| VCCQ > TH2 | 0 | 1 | 1 | 0 |
| TH1 < VCCQ < TH2 | 0 | 1 | 0 | 1 |
| VCCQ < TH1 | 1 | 0 | 0 | 1 |

First Logic Control Circuit 130

First logic control circuit 130 receive the signals Dn, OE, HVQ\ and LVQ, and provides an output current to the gate of pull-up transistor 22. The output current has two functions. First is to set pull-up transistor 22 in either a conducting state or non-conducting state depending upon the values of Dn and OE. As with output driver 20, pull-up transistor 22 is to be placed in a non-conducting state when OE\ signal is in a logic-high state (corresponding to OE in a logic-low state) regardless of the state of Dn, and to be maintained in a non-conducing state when both signals Dn and OE\ are in logic-low states, and to be placed in a conducting state when Dn is in a logic-high state and OE\ is in a logic-low state. The second function of logic circuit 130 is to metering the discharging current to pull-up transistor 22 as a function of the value of VCCQ in order to provide for a more uniform slew rate and slew time for rising signal transitions at output node 21.

Logic control circuit 130 comprises two PMOS transistors 131 and 132, and eight NMOS transistors 133 through 140. PMOS transistor 132 places pull-up transistor 22 in a non-conducting state when signal OE\ is in its logic-high state (corresponding to complement signal OE in a logic-low state). PMOS transistor 131 places pull-up transistor 22 in a non-conducting state when data signal Dn is in a logic-low state and signal OE\ is in a logic-low state. The remaining transistors 133–140 serve to place pull-up transistor 22 in a conducting state when signal Dn is high and signal OE\ is low, with an amount of discharge current that is related to the value of VCCQ, and specifically to the logic states of signals LVQ and HVQ\. Under this state of signals Dn and OE\, each of transistors 133, 134, 136, 137, 138, and 139 is in a conducting state. Transistors 136 and 137 are configured in a series circuit and form a first discharge branch under this state of signals Dn and OE\, regardless of the value of VCCQ. Transistors 133–135 are configured in a series-circuit and form a second discharge branch which is activated when HVQ is in a logic-low state (corresponding to HVQ\ in a logic-high state), and which is deactivated when HVQ is in a logic-high state. Transistors 138–140 are also configured in a series circuit and form a third discharge branch which is activated when LVQ is in a logic-high state, and deactivated when LVQ is in a logic-low state.

When VCCQ is in its midrange of values between thresholds TH1 and TH2, both LVQ and HVQ are in their logic-low states. Under this condition, and with signal OE\ low and signal Dn high, the first and second discharge branches (transistors 136–137 and 133–135, respectively) are in conducting states. When VCCQ falls below the first threshold TH1, LVQ enters it logic-high state (HVQ remains in its logic low state). This causes the third discharge branch formed by transistors 138–140 to become conducting in addition to the first two branches. When VCCQ rises above the second threshold TH2, HVQ enters its logic-high state (LVQ is in a logic-low state). This causes the second branch formed by transistors 133–135 to become non-conducting, which leaves only the first branch formed by transistors 136–137 as conducting.

Thus, there are three active discharge branches when VCCQ is below TH1, two active discharge branches when VCCQ is between TH1 and TH2, and only one active discharge branch when VCCQ is above TH2. In this manner, the rate at which the gate of pull-down transistor 22 is discharged is decreased as the magnitude of VCCQ increases. This causes pull-up transistor 22 to turn-on more slowly as VCCQ increases, thereby compensating for the intrinsic tendency of pull-up transistor 22 to charge up output capacitor $C_L$ more quickly as the magnitude of VCCQ increases.

Second Logic Control Circuit 150

Second logic control circuit 150 receive the signals Dn, Dn\ OE, OE\, HVQ and LVQ, and provides an output current to the gate of pull-down transistor 24. The output current has two functions. First is to set pull-down transistor 24 in either a conducting state or non-conducting state depending upon the values of Dn and OE. As with output driver 20 (FIG. 1), pull-down transistor 24 is to be placed in a non-conducting state when OE\ signal is in a logic-high state (corresponding to OE in a logic-low state) regardless of the state of Dn, to be maintained in a non-conducting state when Dn is in a logic-high state and OE\ is in a logic-low state, and to be placed in a conducing state when both signals Dn and OE\ are in logic-low states. The second function of logic circuit 150 is to metering the charging current to pull-down transistor 24 as a function of the value of VCCQ in order to provide for a more uniform slew rate and slew time for falling signal transitions at output node 21.

Logic control circuit 150 comprises five NMOS transistors 151–155, and five PMOS transistors 156 through 160. NMOS transistor 152 places pull-down transistor 24 in a non-conducting state when signal OE\ is in its logic-high state. PMOS transistor 151 places pull-down transistor 24 in a non-conducting state when data signal Dn is in a logic-high state and signal OE\ is in a logic-low state. The remaining transistors 153–160 serve to place pull-down transistor 24 in a conducting state when both of signals Dn and OE\ are in their logic low states, with an amount of charging current that is related to the value of VCCQ, and specifically to the logic states of signals LVQ and HVQ. When both of signals Dn and OE\ are logic low (corresponding to complement signals Dn\ and OE in logic-high states), each of transistors 153, 154, 156, 157, 158, and 159 is in a conducting state. Transistors 156 and 157 are configured in a series circuit and form a first charging branch under this state of signals Dn and OE\, regardless of the value of VCCQ. Transistors 153–155 are configured in a series-circuit and form a second charging branch which is activated when LVQ is in a logic-high state, and which is deactivated when LVQ is in a logic-low state. Transistors 158–160 are also configured in a series circuit and form a third charging branch which is activated when HVQ is in a logic-low state, and deactivated when HVQ is in a logic-high state.

When VCCQ is in its midrange of values between thresholds TH1 and TH2, both LVQ and HVQ are in their logic-low states. Under this condition, and with signal OE\ low and signal Dn low, the first and third charging branches (transistors 156–157 and 158–160, respectively) are in conducting states. When VCCQ falls below the first threshold TH1, signal LVQ enters it logic-high state (HVQ remains in its logic low state). This causes the second charging branch formed by transistors 153–155 to become conducting in addition to the first and third charging branches. When VCCQ rises above the second threshold TH2, HVQ enters its logic-high state (LVQ is in a logic-low state). This causes the second and third branches formed by transistors 153–155 and 158–160, respectively, to become non-conducting, which leaves only the first branch formed by transistors 156–157 as conducting.

Thus, there are three active charging branches when VCCQ is below TH1, two active charging branches when VCCQ is between TH1 and TH2, and only one active charging branch when VCCQ is above TH2. In this manner, the rate at which the gate of pull-down transistor 24 is charged is decreased as the magnitude of VCCQ increases. This causes pull-down transistor 24 to turn-on more slowly as VCCQ increases, thereby compensating for the intrinsic tendency of pull-down transistor 24 to discharge output capacitor $C_L$ more quickly as the magnitude of VCCQ increases.

Transistor Selection

It may be appreciated that either NMOS transistors or PMOS transistors, or a combination thereof, may be used in each discharging branch of logic control circuit 130 and in each charging branch of logic control circuit 150. In the exemplary implementation of circuit 130, transistors of the same type (NMOS) are used in all three discharging branches. In the exemplary implementation of circuit 150, PMOS transistors are used in the first and third charging branches (transistors 156–157 and 158–160, respectively), and NMOS transistors are used in the second charging branch (transistors 153–155). As is known in the art, NMOS transistor have faster turn-on characteristics than PMOS transistors, which enables them to deliver current to the gates of the drive transistors more quickly. In addition, NMOS transistors can provide large amounts of drive current than PMOS transistors for the same amount of chip surface area. However, an NMOS transistor placed in a charging branch cannot pull the voltage of drive transistor 24 up to the full value of VCCQ. Instead, the NMOS transistor can only bring the gate of transistor 24 up to a value of VCCQ minus the threshold voltage $V_{TN}$ of the device (i.e., VCCQ–$V_{TN}$), at which point the NMOS transistor becomes non-conducting. The same NMOS transistor placed in a discharging branch can bring the gate voltage of the drive transistor (in this case transistor 22) down to zero volts. In a similar manner, a PMOS transistor placed in a discharge branch can only bring the gate of the drive transistor down to a value equal to the threshold voltage $V_{TP}$ of the device, at which point it becomes non-conducting. The same PMOS transistor placed in a charging branch can raise the gate voltage of the drive transistor (in this case transistor 24) up to the full value of VCCQ.

In order to increase the charging rate for the gate of transistor 24 under low VCCQ conditions, NMOS transistors have been used in the second charging branch transistors 153–155) of logic circuit 150. As described above, this branch is activated when signal LVQ is in a logic-high state. While these NMOS transistors cannot fully charge the gate of drive transistor 24 up to a value of VCCQ, the PMOS transistor 156–157 in the first charging branch can. As described above, PMOS transistor 156–157 are active under all VCCQ conditions.

Given a set of target slew rise and fall times that are to be met for an output driver, one of ordinary skill in the art can use a circuit simulator, such as a SPICE (Simulation Program with Integrated Circuit Emphasis) based simulator, to simulate the performance of the output driver under various VCCQ conditions to find a section of devices and device dimensions for transistors 133–140 and 153–160 which met the target times. One exemplary set of device dimensions is provided below in TABLE II for logic control circuit 130 and TABLE III for logic control circuit 150, with TH1=2 V to 2.2 V and TH2=4 V, and with a target of 30 ns for the output slew times.

TABLE II

| Second Discharge Branch | First Discharge Branch | Third Discharge Branch |
|---|---|---|
| Active for middle and low values of VCCQ (VCCQ < TH2). | Active for all values of VCCQ. | Active for only low values of VCCQ (VCCQ < TH1). |
| Transistor 133 | Transistor 136 | Transistor 138 |
| Gate width = 6.0 μm<br>Gate length = 0.7 μm | Gate width = 6.0 μm<br>Gate length = 0.7 μm | Gate width = 20.0 μm<br>Gate length = 0.7 μm |
| Transistor 134 | Transistor 137 | Transistor 139 |

TABLE II-continued

| | | |
|---|---|---|
| Gate width = 6.0 μm | Gate width = 6.0 μm | Gate width = 20.0 μm |
| Gate length = 1.1 μm | Gate length = 2.4 μm | Gate length = 0.7 μm |
| Transistor 135 | | Transistor 140 |
| Gate width = 10.0 μm | | Gate width = 20.0 μm |
| Gate length = 0.7 μm | | Gate length = 0.7 μm |

TABLE III

| Second Discharge Branch | First Discharge Branch | Third Discharge Branch |
|---|---|---|
| Active for middle and low values of VCCQ (VCCQ < TH2). | Active for all values of VCCQ. | Active for only low values of VCCQ (VCCQ < TH1). |
| Transistor 155 | | Transistor 160 |
| Gate width = 30.0 μm | | Gate width = 24.0 μm |
| Gate length = 0.75 μm | | Gate length = 0.8 μm |
| Transistor 154 | Transistor 157 | Transistor 159 |
| Gate width = 30.0 μm | Gate width = 6.0 μm | Gate width = 24.0 μm |
| Gate length = 0.75 μm | Gate length = 1.8 μm | Gate length = 0.8 μm |
| Transistor 153 | Transistor 156 | Transistor 158 |
| Gate width = 30.0 μm | Gate width = 6.0 μm | Gate width = 24.0 μm |
| Gate length = 0.8 μm | Gate length = 0.8 μm | Gate length = 0.8 μm |

Output Driver 200

In output driver 100, the amount of charging current coupled to the gate of pull-down transistor 24 is varied as function of VCCQ by selectively activating one or more charging branches along with the main charging branch as the value of VCCQ decreased. It may be appreciated that a similar variation in the charging current as a function of VCCQ may be accomplished by using one or more minor discharging branches which counteract the main charging branch, and which are selectively activated when the value of VCCQ increases. This approach is used in the output driver embodiment 200 shown in FIG. 5. Also in output driver 100, the amount of discharge current coupled to the gate of pull-up transistor 22 was varied as a function of VCCQ by selectively activating one or more discharge branches along with the main discharge branch as the value of VCCQ decreased. In the embodiment 200 shown in FIG. 5, the variation in the discharging current as a function of VCCQ is accomplished by using one or more minor charging branches which counteract the main discharge branch, and which are selectively activated when the value of VCCQ increases.

Figure 5:
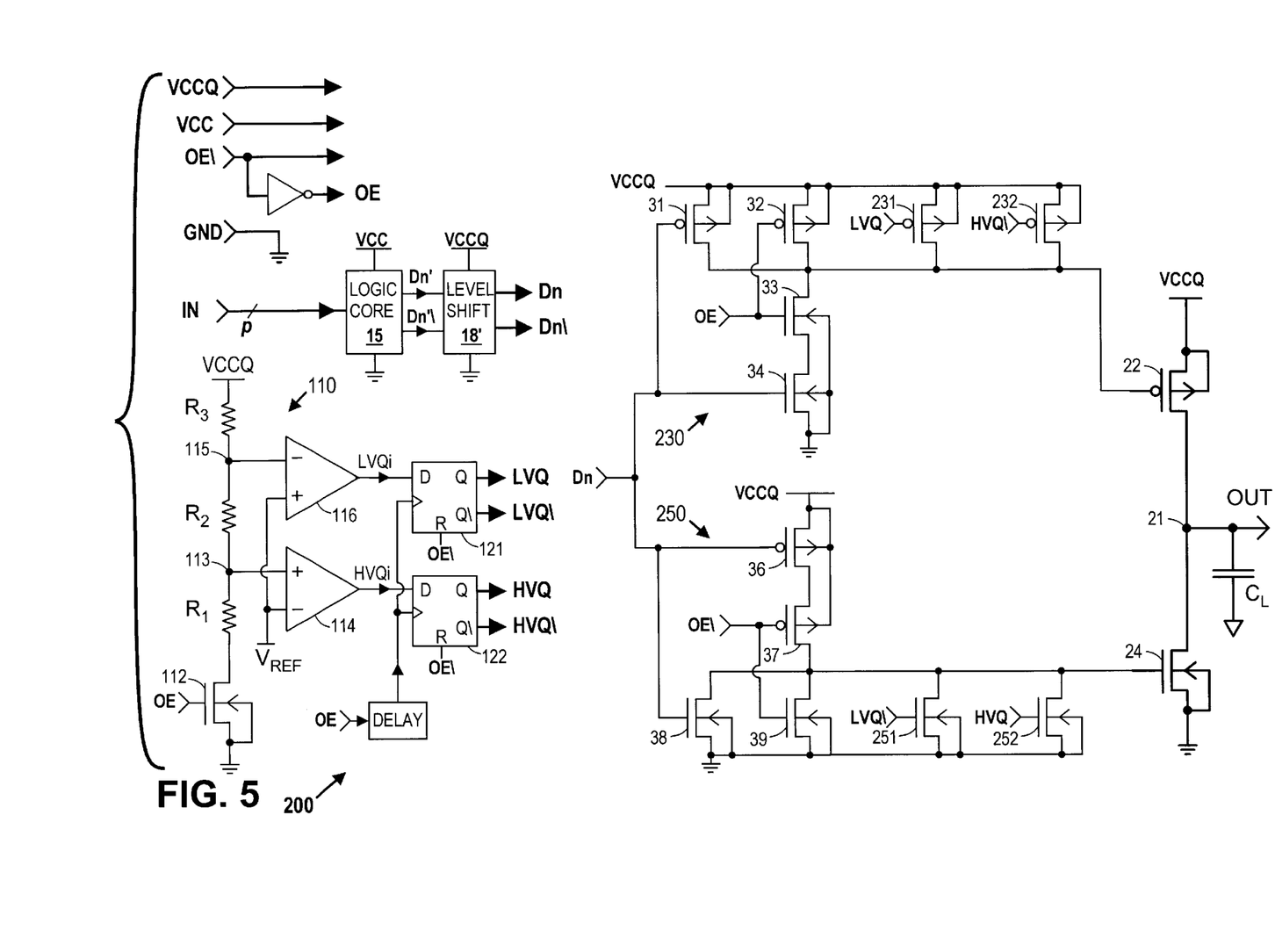
FIG. 5 is a schematic circuit diagram of a second exemplary output driver according to the present invention.

Output driver 200 receives the same input signals as output driver 100, and comprises output node 21, drive transistors 22 and 24, logic core 15, level shifter 18', and voltage detector 110. As in the previous embodiment, voltage detector 110 comprises resistors $R_1$–$R_3$, comparators 114 and 116, select transistor 112, and latches 121 and 122. Output driver 200 further comprises a first logic control circuit 230 for controlling the charging and discharging of the gate of pull-up transistor 24 in response to signals OE\ and Dn and the detected level of VCCQ, and a second logic control circuit 250 for controlling the charging and discharging of the gate of pull-down transistor 22 in response to signals OE\ and Dn and the detected level of VCCQ.

First logic control circuit 230 comprises transistors 31–34 of the previously described output driver 20, with transistors 33 and 34 forming a main discharge branch. Transistor 34 is in a conducting state when Dn is in its logic high state, and a non-conducting state when the Dn is in logic low state. Circuit 230 further comprises a first minor charging branch having a PMOS transistor 231 which selectively couples current to the gate of pull-up transistor 22 from second supply VCCQ, and a second minor charging branch having a PMOS transistor 232 which selectively couples current to the gate of pull-up transistor 22 from second supply VCCQ. PMOS transistor 231 has its gate terminal coupled to signal LVQ, and is in a non-conducting state when the output LVQi of comparator 116 is in its logic-high state and in a conducting state when the comparator output LVQi is in its logic-low state. As previously indicated, LVQi is in its logic high state (e.g., second state) when the first scaled version of VCCQ exceeds reference voltage $V_{REF}$, and in it logic low state (e.g., first state) when the first scaled version is less than $V_{REF}$. PMOS transistor 232 has its gate terminal coupled to signal HVQ\, and is in a non-conducting state when the output HvQi of comparator 114 is in its logic-low state, and is in a conducting state when the comparator output HVQi is in its logic-high state. As previously indicated, HVQi is in its logic-high state (e.g., second state) when the second scaled version of VCCQ exceeds reference voltage $V_{REF}$, and in it logic-low state (e.g., first state) when the second scaled version is less than $V_{REF}$. The maximum current maximum current conducted by each of transistors 231 and 232 (e.g., each of the first and second minor charging branches) is less than the maximum current conducted by transistor 34 of the discharge branch.

When VCCQ is below threshold TH1, signal LVQ=1 and signal HVQ\=1 (see Table I above), and thus transistors 231 and 232 are non-conducting, and the gate of pull-up transistor 22 can be discharged by transistors 33 and 34 without opposing currents from transistors 231 and 232. When VCCQ is between thresholds TH1 and TH2, signal LVQ=0 and signal HVQ\=1, which causes transistor 231 to be conductive and transistor 232 to be non-conductive. Thus, when the gate of pull-up transistor 22 is discharged by transistors 33 and 34, transistor 231 provides a minor opposing current which slows down the overall rate of discharge. When VCCQ is above TH2, signal LVQ=0 and signal HVQ\=0, which causes both of transistors 231 and 232 to be conductive. Thus, when the gate of pull-up transistor 22 is discharged by transistors 33 and 34, both of transistors 231 and 232 provide opposing currents which slows down the overall rate of discharge.

Second logic control circuit 250 comprises transistors 36–39 of the previously described output driver 20, with transistors 36 and 37 forming a main charging branch. Transistor 36 is in a conducting state when Dn is in its logic-low state, and a non-conducting state when the Dn is in logic-high state. Circuit 250 further comprises a first minor discharge branch having a NMOS transistor 251 which selectively couples current from the gate of pull-down transistor 24 to the power return line (ground), and a second minor discharge branch having a NMOS transistor 252 which selectively couples current from the gate of pull-down transistor 24 to the power return line. NMOS transistor 251 has its gate terminal coupled to signal LVQ\, and is in a non-conducting state when the output LVQi of comparator 116 is in its logic-high state and in a conducting state when the comparator output LVQi is in its logic-low state. As previously indicated, LVQi is in its logic high state (e.g., second state) when the first scaled version of VCCQ exceeds reference voltage $V_{REF}$, and in it logic low state (e.g., first state) when the first scaled version is less than $V_{REF}$. NMOS transistor 252 has its gate terminal coupled to signal HVQ, and is in a non-conducting state when the output HVQi of comparator 114 is in its logic-low state, and is in a conducting state when the comparator output HVQi is in its logic-high state. As previously indicated, HVQi is in its logic-high state (e.g., second state) when the second scaled version of VCCQ exceeds reference voltage $V_{REF}$, and in it logic-low state (e.g., first state) when the second scaled version is less than $V_{REF}$. The maximum current maximum current conducted by each of transistors 251 and 252 (e.g., each of the first and second minor charging branches) is less than the maximum current conducted by transistor 34 of the discharge branch.

When VCCQ is below threshold TH1, signal LVQ\=0 and signal HVQ=0 (see Table I above), and thus transistors 251 and 252 are non-conducting, and the gate of pull-down transistor 24 can be charged by transistors 36 and 37 without opposing currents from transistors 251 and 252. When VCCQ is between thresholds TH1 and TH2, signal LVQ\=1 and signal HVQ=0, which causes transistor 251 to be conductive and transistor 252 to be non-conductive. Thus, when the gate of pull-down transistor 24 is charged by transistors 36 and 37, transistor 251 provides a minor opposing current which slows down the overall rate of discharge. When VCCQ is above TH2, signal LVQ\=1 and signal HVQ=1, which causes both of transistors 251 and 252 to be conductive. Thus, when the gate of pull-down transistor 24 is discharged by transistors 36 and 37, both of transistors 251 and 252 provide opposing currents which slows down the overall rate of discharge.

While the present inventions have been particularly described with respect to the illustrated embodiment, it will be appreciated that various alterations, modifications and adaptations may be made based on the present disclosure, and are intended to be within the scope of the present inventions. For example, various logic orientations may be changes within detector 110 and logic circuits 130, 150, 230 and 250, and logic inversion may be added therein. While the inventions have been described in connection with what is presently considered to be the most practical and preferred embodiments, it is to be understood that they are not limited to the disclosed embodiments but, on the contrary, is intended to cover various modifications and equivalent arrangements included within the scope of the appended claims.

What is claimed is:

1. An output buffer for a digital integrated circuit chip, the chip having a core which is powered by a first supply voltage VCC which is received at a first supply voltage port, said output buffer comprising:

a second supply voltage port for receiving a second supply voltage VCCQ;

a power return line port;

an output port for providing a voltage output;

an input port for receiving an input data value representative of the voltage value to be provided at said output, the input data value having a first state when a logic-low voltage is to be generated at the output and a second state when a logic-high voltage is to be generated at the output;

a comparator having a first input coupled to a scaled version of the second supply voltage VCCQ, a second input coupled to a reference voltage $V_{REF}$, and an output providing a voltage which is related to the difference between the scaled version and the reference voltage;

a pull-up transistor having a gate electrode, a source electrode, and a drain electrode, one of the source and drain electrodes being coupled to the second voltage supply port and the other of said source and drain electrodes being coupled to the output;

a pull-down transistor having a gate electrode, a source electrode, and a drain electrode, one of the source and drain electrodes being coupled to the return line port and the other of said source and drain electrodes being coupled to the output; and a first logic control circuit responsive to the input data value and the value of the comparator output for discharging the gate of the pull-up transistor when the input data value is in its second state, said first logic control circuit discharging the gate of the pull-up transistor at a rate which varies with the value of the comparator output.

2. The output buffer of claim 1 wherein the comparator (114 or 116) output has a first logic state when the scaled version of the second power supply voltage VCCQ is greater than the reference voltage $V_{REF}$, and a second logic state when the scaled version of the second power supply voltage VCCQ is less than the reference voltage $V_{REF}$, and wherein said first logic control circuit discharges the gate of the pull-up transistor at a slower rate when said comparator output is in its first logic state.

3. The output buffer of claim 2 wherein said first logic control circuit comprises a first discharge branch and a second discharge branch, said first discharge branch having a first branch transistor (137) which is in a conducting state when the input data value is in its second state and a non-conducting state when the input data value is in its first state, said second discharge branch comprising a second branch transistor (134 or 139) and a third branch transistor (135 or 140) coupled in series, the second branch transistor being in a conducting state when the input data value is in its second state and a non-conducting state when the input data value is in its first state, and said third branch transistor being in a conducting state when the comparator output (HVQi or LVQi) is in its second logic state and a non-conducting state when the comparator output is in its first logic state.

4. The output buffer of claim 2 wherein the comparator comprises a first comparator (116) of the output buffer and wherein the scaled version of the second power supply VCCQ is designated as a first scaled version thereof, the output (LVQi) of the first comparator having a first logic state when the first scaled version is greater than the reference voltage $V_{REF}$, and a second logic state when the first scaled version is less than the reference voltage $V_{REF}$;

wherein the output buffer further comprises a second comparator (114) having a first input coupled to a second scaled version of the second supply voltage VCCQ, a second input coupled to a second reference voltage, and an output (HVQi) which has a first logic state when the second scaled version is greater than the second reference voltage, and a second logic state when the second scaled version is less than the second reference voltage;

wherein said first logic control circuit comprises a first discharge branch, a second discharge branch, and a third discharge branch, said first discharge branch having a first branch transistor (137) which is in a conducting state when the input data value is in its second state and a non-conducting state when the input data value is in its first state, said second discharge branch comprising a second branch transistor (139) and a third branch transistor (140) coupled in series, the second branch transistor being in a conducting state when the input data value is in its second state and a non-conducting state when the input data value is in its first state, and said third branch transistor being in a conducting state when the output (LVQi) of the first comparator is in its second logic state and a non-conducting state when the comparator output is in its first logic state, said third discharge branch comprising a fourth branch transistor (134) and a fifth branch transistor (135) coupled in series, the fourth branch transistor being in a conducting state when the input data value is in its second state and a non-conducting state when the input data value is in its first state, and said fifth branch transistor being in a conducting state when the output (HVQi) of the second comparator is in its second logic state and a non-conducting state when the comparator output is in its first logic state.

5. The output buffer of claim 4 wherein the second reference voltage is equal in value to the first reference voltage $V_{REF}$.

6. The output buffer of claim 5 wherein the first scaled version of the second power supply VCCQ is greater than the second scaled version of the second power supply VCCQ.

7. The output buffer of claim 1 further comprising a second logic control circuit responsive to the input data value and the value of the comparator output for charging the gate of the pull-down transistor when the input data value is in its first state, said second logic control circuit charging the gate of the pull-down transistor at a rate which varies with the value of the comparator output.

8. The output buffer of claim 7 wherein the comparator output has a first logic state when the scaled version of the second power supply voltage VCCQ is greater than the reference voltage $V_{REF}$, and a second logic state when the scaled version of the second power supply voltage VCCQ is less than the reference voltage $V_{REF}$, and wherein said second logic control circuit charges the gate of the pull-down transistor at a slower rate when said comparator output is in its first logic state.

9. The output buffer of claim 3 further comprising a second logic control circuit responsive to the input data value and the value of the comparator output for charging the gate of the pull-down transistor when the input data value is in its first state, said second logic control circuit charging the gate of the pull-down transistor at a rate which varies with the value of the comparator output.

10. The output buffer of claim 9 wherein said second logic control circuit charges the gate of the pull-down transistor at a slower rate when said comparator output is in its first logic state.

11. The output buffer of claim 2 wherein said first logic control circuit comprises a first discharge branch and a first minor charging branch, said first discharge branch having a first branch transistor (34) which is in a conducting state when the input data value is in its second state and a non-conducting state when the input data value is in its first state, said first minor charging branch comprising a second branch transistor (231 or 232), the second branch transistor being in a non-conducting state when the comparator output HVQi or LVQi) is in its second logic state and a conducting state when the comparator output is in its first logic state, the maximum current conducted by the first minor charging branch being less than the maximum current conducted by the first discharge branch.

12. The output buffer of claim 2 wherein the comparator comprises a first comparator (116) of the output buffer and wherein the scaled version of the second power supply VCCQ is designated as a first scaled version thereof, the output (LVQi) of the first comparator having a first logic state when the first scaled version is greater than the reference voltage $V_{REF}$, and a second logic state when the first scaled version is less than the reference voltage $V_{REF}$;

wherein the output buffer further comprises a second comparator (114) having a first input coupled to a second scaled version of the second supply voltage VCCQ, a second input coupled to a second reference voltage, and an output (HVQi) which has a first logic state when the second scaled version is greater than the second reference voltage, and a second logic state when the second scaled version is less than the second reference voltage;

said first logic control circuit comprises a first discharge branch, a first minor charging branch, and a second minor charging branch, said first discharge branch having a first branch transistor (34) which is in a conducting state when the input data value is in its second state and a non-conducting state when the input data value is in its first state, said first minor charging branch comprising a second branch transistor (231), the second branch transistor being in a non-conducting state when the first comparator output (LVQi) is in its second logic state and a conducting state when the first comparator output is in its first logic state, said second minor charging branch comprising a third branch transistor (232), the third branch transistor being in a non-conducting state when the second comparator output (HVQi) is in its second logic state and a conducting state when the second comparator output is in its first logic state, the maximum current conducted by the first minor charging branch being less than the maximum current conducted by the first discharge branch, the maximum current conducted by the second minor charging branch being less than the maximum current conducted by the first discharge branch.

13. The output buffer of claim 12 wherein the second reference voltage is equal in value to the first reference voltage $V_{REF}$.

14. The output buffer of claim 13 wherein the first scaled version of the second power supply VCCQ is greater than the second scaled version of the second power supply VCCQ.

15. An output buffer for a digital integrated circuit chip, the chip having a core which is powered by a first supply voltage VCC which is received at a first supply voltage port, said output buffer comprising:

a second supply voltage port for receiving a second supply voltage VCCQ;

a power return line port;

an output port for providing a voltage output;

an input port for receiving an input data value representative of the voltage value to be provided at said output, the input data value having a first state when a logic-low voltage is to be generated at the output and a second state when a logic-high voltage is to be generated at the output;

a comparator having a first input coupled to a scaled version of the second supply voltage VCCQ, a second input coupled to a reference voltage $V_{REF}$, and an output providing a voltage which is related to the difference between the scaled version and the reference voltage;

a pull-up transistor having a gate electrode, a source electrode, and a drain electrode, one of the source and drain electrodes being coupled to the second voltage supply port and the other of said source and drain electrodes being coupled to the output;

a pull-down transistor having a gate electrode, a source electrode, and a drain electrode, one of the source and drain electrodes being coupled to the return line port and the other of said source and drain electrodes being coupled to the output; and a logic control circuit responsive to the input data value and the value of the comparator output for charging the gate of the pull-down transistor when the input data value is in its first state, said logic control circuit charging the gate of the pull-down transistor at a rate which varies with the value of the comparator output.

16. The output buffer of claim 15 wherein the comparator output (114 or 116) has a first logic state when the scaled version of the second power supply voltage VCCQ is greater than the reference voltage $V_{REF}$, and a second logic state when the scaled version of the second power supply voltage VCCQ is less than the reference voltage $V_{REF}$, and wherein said logic control circuit charges the gate of the pull-down transistor at a slower rate when said comparator output is in its first logic state.

17. The output buffer of claim 16 wherein said logic control circuit comprises a first charging branch and a second charging branch, said first charging branch having a first branch transistor (157) which is in a non-conducting state when the input data value is in its second state and a conducting state when the input data value is in its first state, said second charging branch comprising a second branch transistor (154 or 159) and a third branch transistor (155 or 160) coupled in series, the second branch transistor being in a non-conducting state when the input data value is in its second state and a conducting state when the input data value is in its first state, and said third branch transistor being in a conducting state when the comparator output (HVQi or LVQi) is in its second logic state and a non-conducting state when the comparator output is in its first logic state.

18. The output buffer of claim 16 wherein the comparator comprises a first comparator (116) of the output buffer and wherein the scaled version of the second power supply VCCQ is designated as a first scaled version thereof, the output (LVQi) of the first comparator having a first logic state when the first scaled version is greater than the reference voltage $V_{REF}$, and a second logic state when the first scaled version is less than the reference voltage $V_{REF}$;

wherein the output buffer further comprises a second comparator (114) having a first input coupled to a second scaled version of the second supply voltage VCCQ, a second input coupled to a second reference voltage, and an output (HVQi) which has a first logic state when the second scaled version is greater than the second reference voltage, and a second logic state when the second scaled version is less than the second reference voltage;

wherein said first logic control circuit comprises a first charging branch, a second charging branch, and a third charging branch, said first charging branch having a first branch transistor (157) which is in a non-conducting state when the input data value is in its second state and a conducting state when the input data value is in its first state, said second charging branch comprising a second branch transistor (154) and a third branch transistor (155) coupled in series, the second branch transistor being in a non-conducting state when the input data value is in its second state and a conducting state when the input data value is in its first state, and said third branch transistor being in a conducting state when the output (LVQi) of the first comparator is in its second logic state and a non-conducting state when the comparator output is in its first logic state, said third charging branch comprising a fourth branch transistor (159) and a fifth branch transistor (160) coupled in series, the fourth branch transistor being in a non-conducting state when the input data value is in its second state and a conducting state when the input data value is in its first state, and said fifth branch transistor being in a conducting state when the output (HVQi) of the second comparator is in its second logic state and a non-conducting state when the comparator output is in its first logic state.

19. The output buffer of claim 18 wherein the second reference voltage is equal in value to the first reference voltage $V_{REF}$.

20. The output buffer of claim 19 wherein the first scaled version of the second power supply VCCQ is greater than the second scaled version of the second power supply VCCQ.

21. The output buffer of claim 16 wherein said logic control circuit comprises a first charging branch and a first minor discharge branch, said first charging branch having a first branch transistor (36) which is in a conducting state when the input data value is in its first state and a non-conducting state when the input data value is in its second state, said first minor discharge branch comprising a second branch transistor (251 or 252), the second branch transistor being in a non-conducting state when the comparator output (LVQi or HVQi) is in its second logic state and a conducting state when the comparator output is in its first logic state, the maximum current conducted by the first minor charging branch being less than the maximum current conducted by the first discharge branch.

22. The output buffer of claim 16 wherein the comparator comprises a first comparator (116) of the output buffer and wherein the scaled version of the second power supply VCCQ is designated as a first scaled version thereof, the output (LVQi) of the first comparator having a first logic state when the first scaled version is greater than the reference voltage $V_{REF}$, and a second logic state when the first scaled version is less than the reference voltage $V_{REF}$;

wherein the output buffer further comprises a second comparator (114) having a first input coupled to a second scaled version of the second supply voltage VCCQ, a second input coupled to a second reference voltage, and an output (HVQi) which has a first logic state when the second scaled version is greater than the second reference voltage, and a second logic state when the second scaled version is less than the second reference voltage;

wherein said logic control circuit comprises a first charging branch, a first minor discharge branch, and a second minor discharge branch, said first charging branch having a first branch transistor (36) which is in a conducting state when the input data value is in its first state and a non-conducting state when the input data value is in its second state, said first minor discharge branch comprising a second branch transistor (251), the second branch transistor being in a non-conducting state when the first comparator output (LVQi) is in its second logic state and a conducting state when the first comparator output is in its first logic state, said second minor discharge branch comprising a third branch transistor (252), the third branch transistor being in a non-conducting state when the second comparator output (HVQi) is in its second logic state and a conducting state when the second comparator output is in its first logic state, the maximum current conducted by the first minor discharge branch being less than the maximum current conducted by the first chargeing branch, the maximum current conducted by the second minor discharge branch being less than the maximum current conducted by the first charging branch.

23. The output buffer of claim 22 wherein the second reference voltage is equal in value to the first reference voltage $V_{REF}$.

24. The output buffer of claim 23 wherein the first scaled version of the second power supply VCCQ is greater than the second scaled version of the second power supply VCCQ.

* * * * *